(12) United States Patent
Morita et al.

(10) Patent No.: US 10,613,425 B2
(45) Date of Patent: Apr. 7, 2020

(54) LIGHT SOURCE DEVICE AND MANUFACTURING METHOD THEREOF

(71) Applicant: SHARP KABUSHIKI KAISHA, Sakai, Osaka (JP)

(72) Inventors: Takatoshi Morita, Sakai (JP); Noriaki Fujii, Sakai (JP); Toshio Kagawa, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 16/113,452

(22) Filed: Aug. 27, 2018

(65) Prior Publication Data

US 2019/0064643 A1 Feb. 28, 2019

(30) Foreign Application Priority Data

Aug. 30, 2017 (JP) ................. 2017-166142

(51) Int. Cl.
| | |
|---|---|
| G03B 21/20 | (2006.01) |
| H01S 5/022 | (2006.01) |
| H01S 5/024 | (2006.01) |
| H01S 5/40 | (2006.01) |
| H01S 5/00 | (2006.01) |
| H01S 5/02 | (2006.01) |

(52) U.S. Cl.
CPC ....... G03B 21/208 (2013.01); G03B 21/2013 (2013.01); G03B 21/2033 (2013.01); H01S 5/02252 (2013.01); H01S 5/02288 (2013.01); H01S 5/02469 (2013.01); H01S 5/4012 (2013.01); H01S 5/005 (2013.01); H01S 5/0071 (2013.01); H01S 5/02 (2013.01); H01S 5/4093 (2013.01)

(58) Field of Classification Search
CPC .............. G03B 21/208; G03B 21/2033; G03B 21/2013; H01S 5/2252; H01S 5/4012; H01S 5/02469; H01S 5/02288; H01S 5/005; H01S 5/02; H01S 5/4093; H01S 5/0071

See application file for complete search history.

(56) References Cited

U.S. PATENT DOCUMENTS

| | | | |
|---|---|---|---|
| 2002/0090015 A1 | 7/2002 | Nakajima et al. | |
| 2003/0210729 A1* | 11/2003 | Nakaya | H01S 5/146 372/97 |
| 2016/0079728 A1 | 3/2016 | Matsuyama et al. | |
| 2017/0207606 A1 | 7/2017 | Morita et al. | |

FOREIGN PATENT DOCUMENTS

WO 2016/002267 A1 1/2016

* cited by examiner

*Primary Examiner* — David V Bruce
(74) *Attorney, Agent, or Firm* — ScienBiziP, P.C.

(57) ABSTRACT

A housing provided to a light source device has a sliding surface to which a first lens portion is fixed and an inclined support surface to which a second lens portion is fixed. The sliding surface is vertical to a direction of an optical axis of a semiconductor laser and wider than a first fixing surface of the first lens portion that is fixed to the sliding surface. The inclined support surface is parallel to the direction of the optical axis and wider than a second fixing surface of the second lens portion that is fixed to the inclined support surface.

13 Claims, 8 Drawing Sheets

FIG. 11A
FIG. 11B
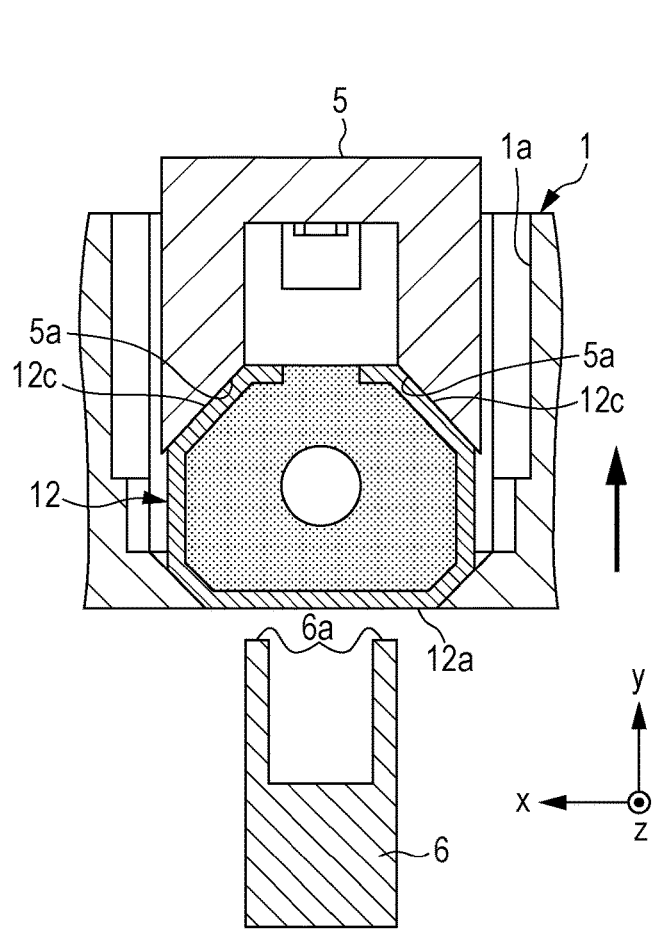
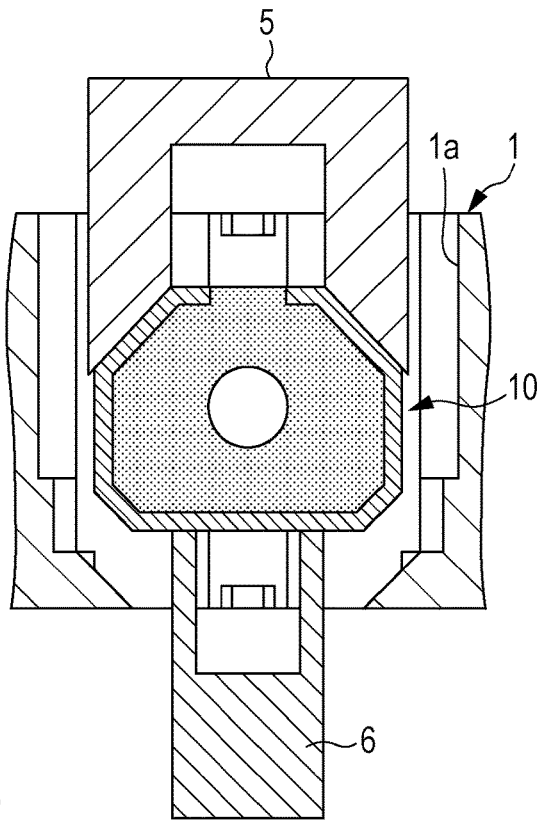

LIGHT SOURCE DEVICE AND MANUFACTURING METHOD THEREOF

BACKGROUND

1. Field

The present disclosure relates to a light source device that uses two lenses.

2. Description of the Related Art

A small-sized light source module that uses a light source such as a semiconductor laser has to have a thin thickness for use as a light source device for a projector. Thus, the small-sized light source module is restricted to a light source module whose lens size is small. Thus, because the lens has to be arranged close to a light emission point of the semiconductor laser, high precision such as 10 μm to several μm is requested for an allowable offset of the distance between the light emission point of the semiconductor laser and the lens.

International Publication No. WO2016/002267 Pamphlet (laid open on Jan. 7, 2016) discloses a method in which a lens is spatially adjusted and fixed by using an adhesive such as a thermosetting resin or a UV curing resin in an optical module that uses such a small-sized lens.

However, in such an above lens fixing method, the lens is fixed after position adjustment in each direction of three dimensions. Thus, even in a case where an adhesive is applied for fixing for any direction of X axis, Y axis, and Z axis, an influence of curing shrinkage of the adhesive on the fixing position in the other direction may not be avoided. Accordingly, there is a problem in that the lens moves in adhesion.

Due to such a problem, when the lens is adhered after optical axis adjustment and beam spot size adjustment are performed, the lens is offset due to the curing shrinkage of the adhesive. In addition, this problem especially occurs in a high temperature action. Because the lens is offset because an adhesive portion for fixing the lens to a housing swells due to a high temperature, the optical axis of the laser changes in accordance with the temperature. Consequently, in a case where the light source device is incorporated in a projector or the like, there is a concern that a projected image becomes hazy or blurry due to relative offsets of optical axes of plural lasers. Further, presently, there is a strong demand for a light source device that is small-sized and further has optical characteristics of convergence and divergence, which are difficult to realize by one lens, in the market. Further, there is a strong demand for reliability of the capability of a stable action at a high temperature.

It is desirable to provide a light source device that may reduce an influence of curing shrinkage of an adhesive, which occurs to any direction of three dimensions in adhesion fixing of a lens of a small-sized light source device and that may reduce an optical axis offset in a high temperature action.

SUMMARY

According to one aspect of the present disclosure, there is provided a light source device including: a semiconductor laser; a first lens portion; a second lens portion; and a housing that retains the semiconductor laser, the first lens portion, and the second lens portion. The housing has a first surface to which the first lens portion is fixed and a second surface to which the second lens portion is fixed, the first surface is vertical to a direction of an optical axis of the semiconductor laser and wider than a first fixing surface of the first lens portion that is fixed to the first surface, and the second surface is parallel to the direction of the optical axis and wider than a second fixing surface of the second lens portion that is fixed to the second surface.

BRIEF DESCRIPTION OF THE DRAWINGS

FIG. 11A is a principal portion cross-sectional diagram that illustrates a state where a chucking mechanism and a clamping mechanism retain the first lens holder, and FIG. 11B is a principal portion cross-sectional diagram that illustrates a state where the chucking mechanism and the clamping mechanism move the first lens holder;

DESCRIPTION OF THE EMBODIMENTS

[First Embodiment]

A first embodiment of the present disclosure will be described in the following based on FIG. 1 to FIG. 8.

<Configuration of Light Source Device>

Figure 1:
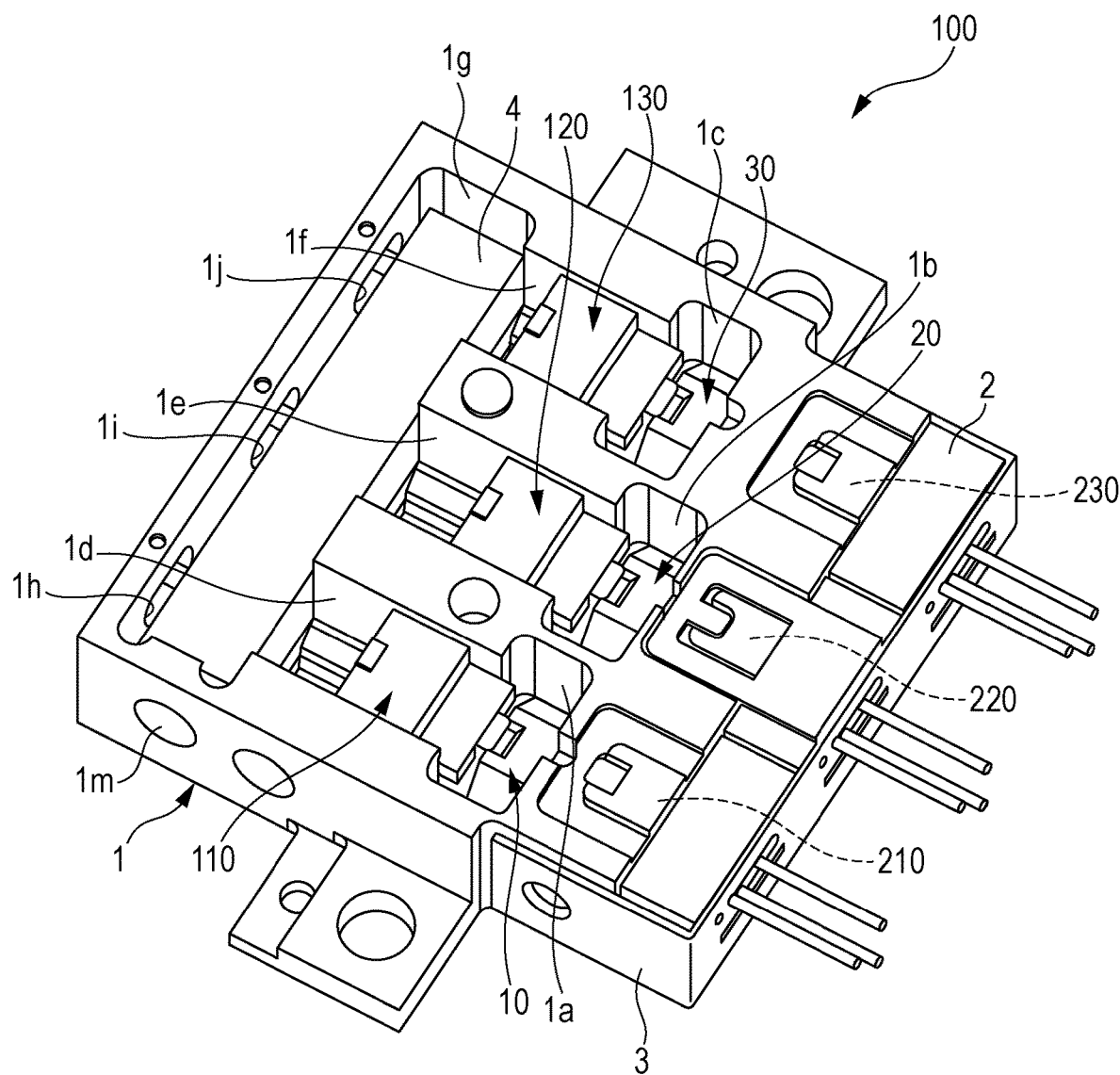
FIG. 1 is a perspective diagram that illustrates an external appearance of a light source device according to a first embodiment of the present disclosure.
Figure 2A:
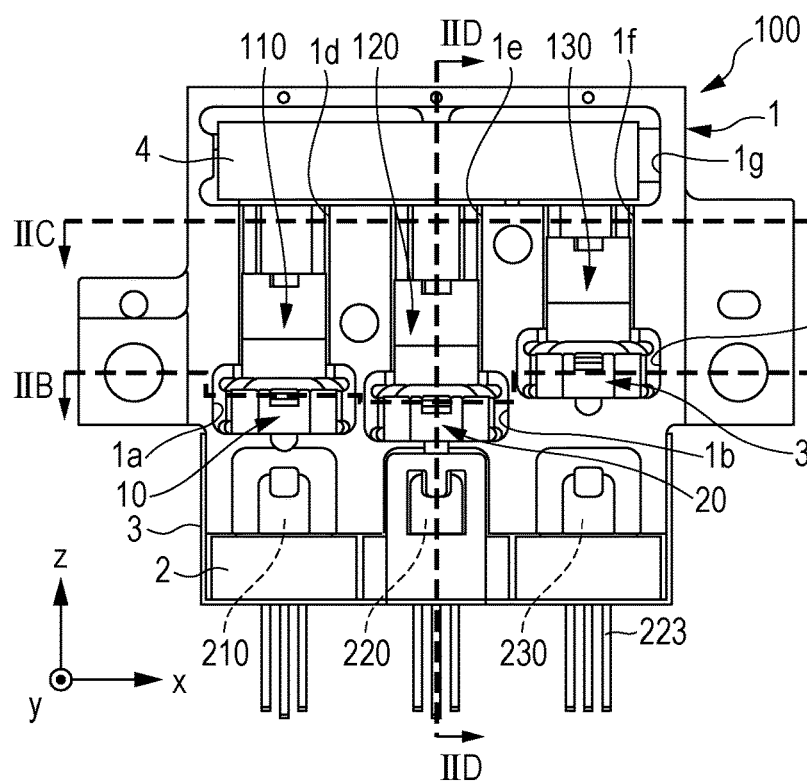
FIG. 2A is a plan diagram that illustrates a configuration of the light source device.
Figure 2D:
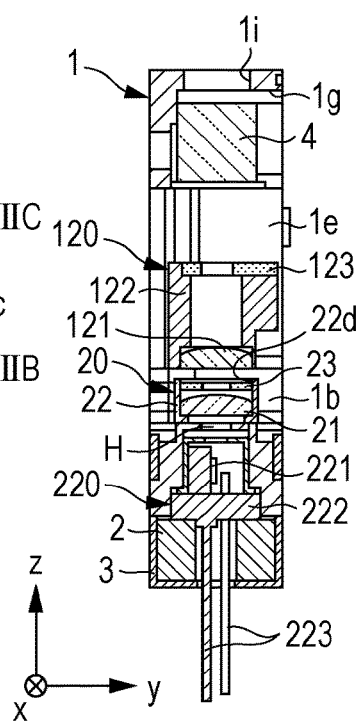
FIG. 2D is an arrow cross-sectional diagram taken along line IID-IID in FIG. 2A.
Figure 2B:
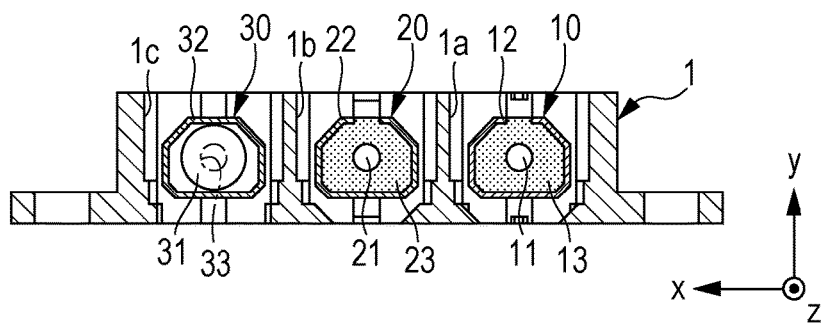
FIG. 2B is an arrow cross-sectional diagram taken along line IIB-IIB in FIG. 2A.
Figure 2C:
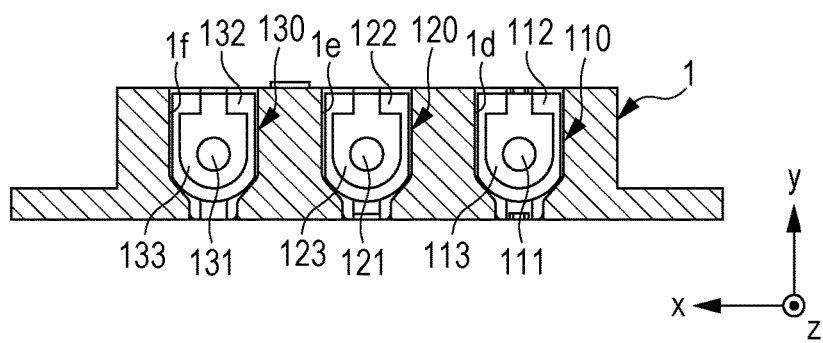
FIG. 2C is an arrow cross-sectional diagram taken along line IIC-IIC in FIG. 2A.

FIG. 1 is a perspective diagram that illustrates an external appearance of a light source device 100 according to this embodiment. FIG. 2A is a plan diagram that illustrates a configuration of the light source device 100. FIG. 2B is an arrow cross-sectional diagram taken along line IIB-IIB in FIG. 2A. FIG. 2C is an arrow cross-sectional diagram taken along line IIC-IIC in FIG. 2A. FIG. 2D is an arrow cross-sectional diagram taken along line IID-IID in FIG. 2A.

As illustrated in FIG. 1 and FIGS. 2A to 2D, the light source device 100 includes a housing 1, a laser holder 2, a fixing spring 3, a composite prism 4, first lens portions 10, 20, and 30, second lens portions 110, 120, and 130, and semiconductor lasers 210, 220, and 230.

<Configurations of Housing and Portions>

Figure 3:
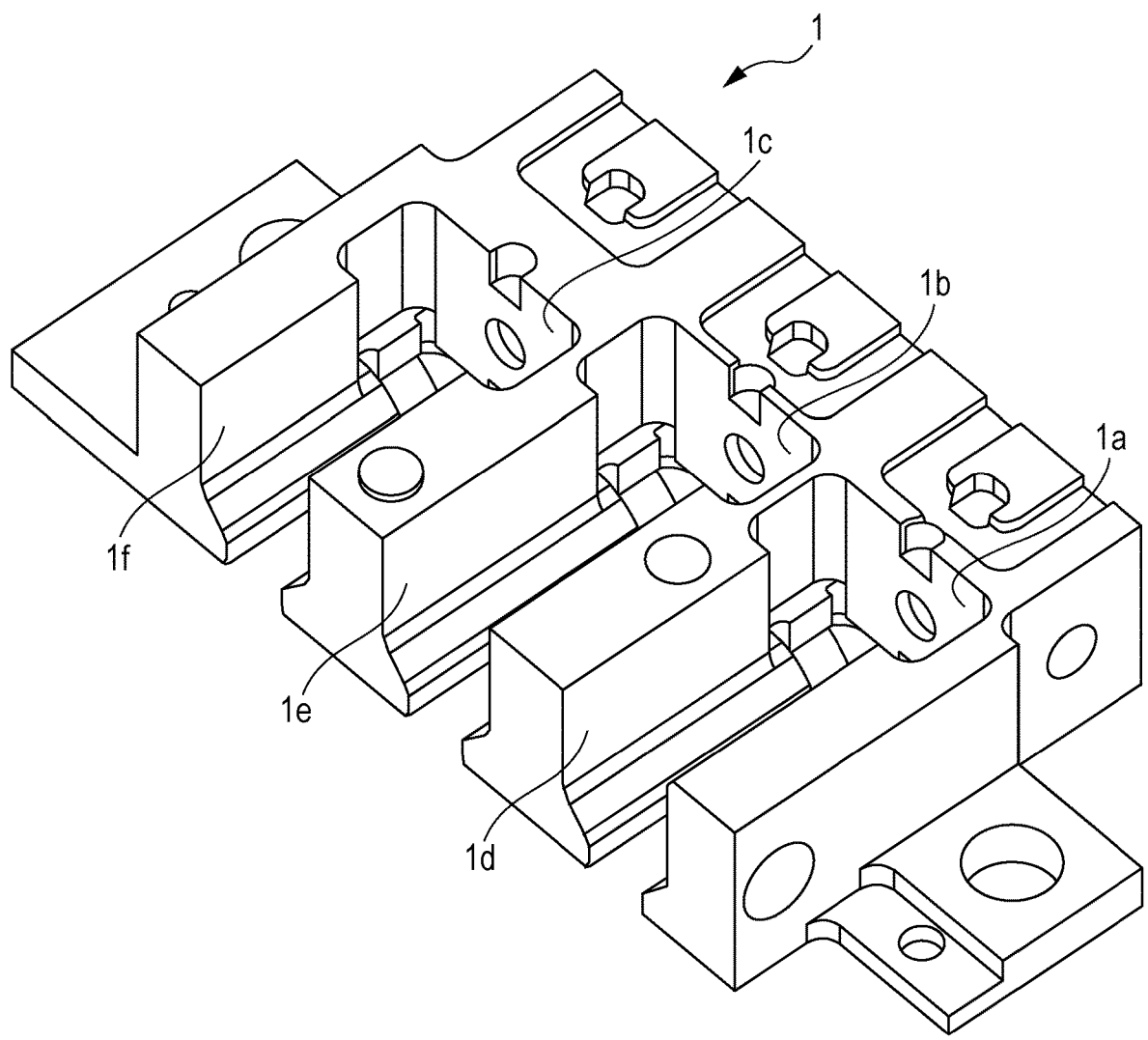
FIG. 3 is a perspective diagram that illustrates a portion of a housing in the light source device.
Figure 4:
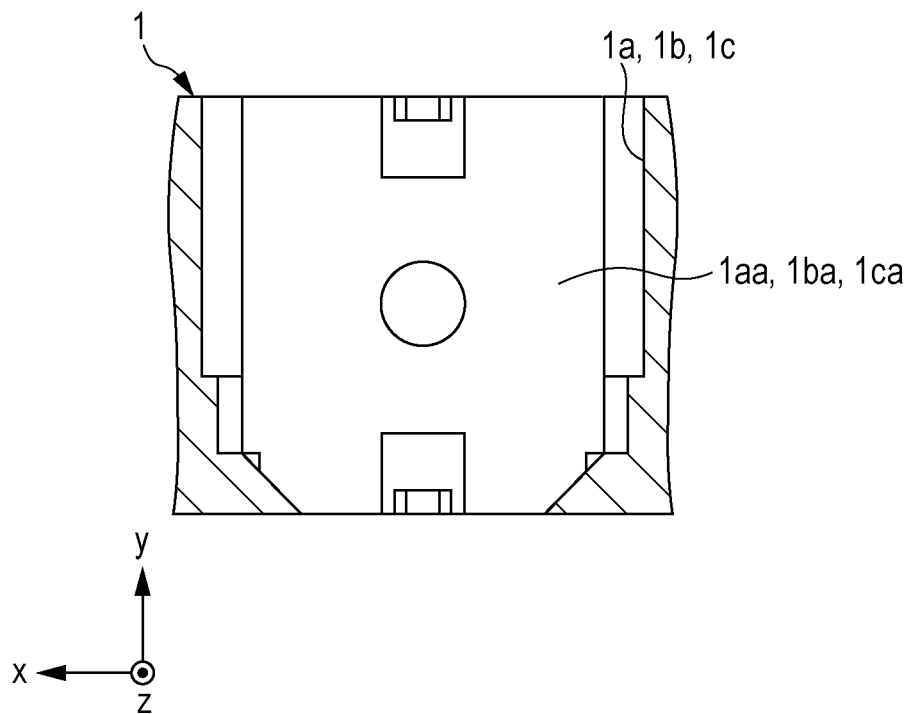
FIG. 4 is a principal portion cross-sectional diagram that illustrates a sliding surface on which a first lens holder slides in the housing.
Figure 5:
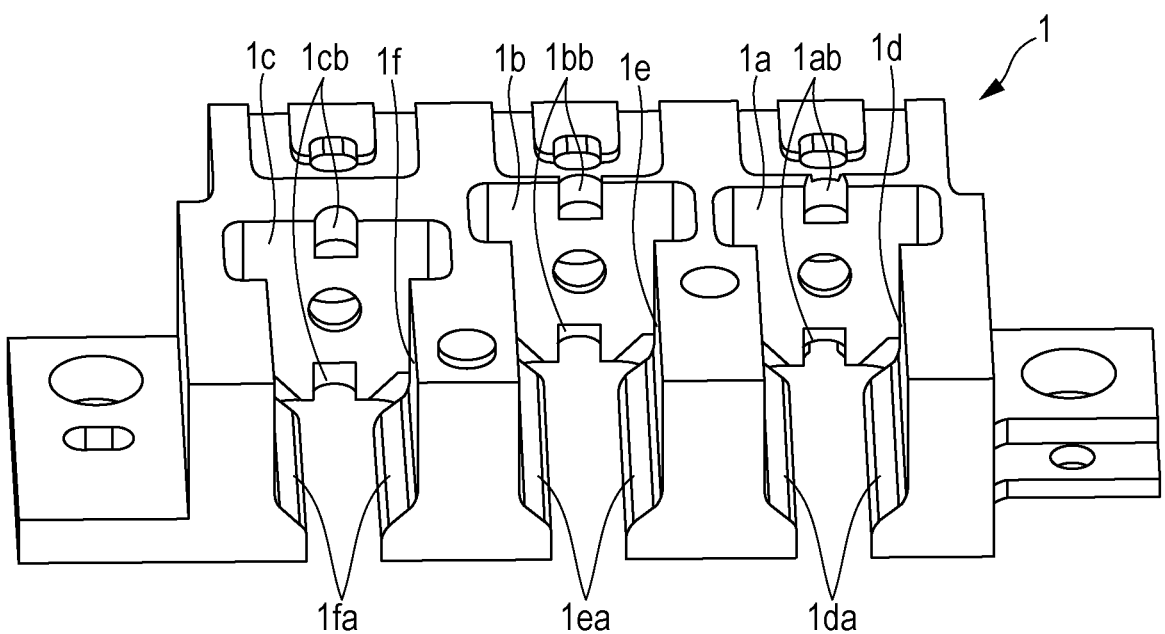
FIG. 5 is a perspective diagram, which illustrates a portion of the housing, as seen from another direction than FIG. 3.

FIG. 3 is a perspective diagram that illustrates a portion of the housing 1 in the light source device 100. FIG. 4 is a principal portion cross-sectional diagram that illustrates sliding surfaces on which first lens holders 12, 22, and 32 slide in the housing 1. FIG. 5 is a perspective diagram, which illustrates a portion of the housing 1, as seen from another direction than FIG. 3.

The housing 1 is formed of metal or a resin into a cube having a prescribed thickness and houses the composite prism 4, the first lens portions 10, 20, and 30, the second lens portions 110, 120, and 130, and the semiconductor lasers 210, 220, and 230. As the metal, a material such as copper or aluminum with high thermal conductivity is preferable, but a metal material such as zinc, brass, or kovar may be used. Further, it is further preferable that a black anodized aluminum treatment is conducted for the housing 1.

The semiconductor lasers 210, 220, and 230 are fitted in one end portion of the housing 1. Holes (for example, a through hole H illustrated in FIG. 2D) are formed such that emitted light from the semiconductor lasers 210, 220, and 230 passes to the side on which the first lens portions 10, 20, and 30 are arranged.

Respective rear end sides of the semiconductor lasers 210, 220, and 230 are retained by the laser holder 2. The laser holder 2 has a function of a heat sink. The light source device 100 is a small-sized light source module, and the volume of the housing 1 is thus small. Thus, the heat dissipation of the semiconductor lasers 210, 220, and 230 themselves is not very high. Accordingly, retaining the semiconductor lasers 210, 220, and 230 by the laser holder 2 that functions as the heat sink improves the heat dissipation of the semiconductor lasers 210, 220, and 230. The material of the laser holder 2 may be a material with high thermal conductivity, and copper, aluminum, brass, a ceramic, or the like may be used. Further, it is further preferable that the black anodized aluminum treatment is conducted for the laser holder 2.

The laser holder 2 is fixed to the housing 1 by the fixing spring 3. The fixing spring 3 is a metal plate that fixes the laser holder 2 so as to press the laser holder 2 to the housing 1, and has a function of a spring.

The semiconductor laser 210 is a blue laser whose wavelength is approximately 450 nm. The semiconductor laser 220 is a green laser whose wavelength is approximately 525 nm. The semiconductor laser 230 is a red laser whose wavelength is approximately 640 nm.

As illustrated in FIG. 2D, the semiconductor laser 220 has a semiconductor laser element 221 formed with a semiconductor laser chip and a submount, a stem 222, and three lead pins 223. The semiconductor laser element 221 is fixed on the stem 222 and emits laser light (beam) toward the first lens portion 20 side. The lead pin 223 is drawn out from the laser holder 2 to the outside. The other semiconductor lasers 210 and 230 are configured similarly to the semiconductor laser 220, but the colors of emitted light are different.

The housing 1 has first lens retaining recesses 1a to 1c, second lens retaining recesses 1d to 1f, and a composite prism retaining recess 1g.

The composite prism retaining recess 1g is a recess that is provided for housing the composite prism 4. The composite prism retaining recess 1g is formed long in the vertical direction (x direction) on a horizontal plane with respect to the directions of optical axes (the z direction in FIG. 2A) of emitted light of the semiconductor lasers 210, 220, and 230 in the vicinity of a light emission side in the housing 1.

On one end side of the composite prism retaining recess 1g in the housing 1, an optically multiplexing emission hole 1m is formed which passes through from the composite prism retaining recess 1g to the outside. As described later, the optically multiplexing emission hole 1m is provided to emit the light that is multiplexed by the composite prism 4. Further, in an end portion on the light emission side in the housing 1, light emission holes 1h to 1j are formed which pass through from the composite prism retaining recess 1g to the outside. The emitted light of the semiconductor lasers 210, 220, and 230 are emitted to the outside through the light emission holes 1h to 1j. The intensity of the emitted light may be monitored by detecting the light emitted to the outside by a photodiode (PD) or the like.

The composite prism 4 is an optical component that has a function of transmitting a specific wavelength or a function of reflecting a specific wavelength by combining a dichroic mirror and glass. The composite prism 4 is formed into a cuboid that extends long and is arranged such that the longitudinal direction thereof is along the x direction of FIG. 2A. The composite prism 4 respectively emits the beams of laser light that are emitted from the second lens portions 110, 120, and 130 but may emit the laser light while multiplexing those beams of laser light. The composite prism 4 emits multiplexed light in a different direction from the direction in which an individual beam of laser light is emitted (z direction), for example, in a lateral direction (the opposite direction to the x direction).

The first lens retaining recesses 1a to 1c are recesses that are provided for respectively retaining the first lens portions 10, 20, and 30. The first lens retaining recesses 1a to 1c are open on lower surface sides as illustrated in FIG. 2B, FIG. 3, and FIG. 4. The first lens retaining recesses 1a to 1c are formed symmetrically with respect to the plane, which includes the optical axes of the semiconductor lasers 210, 220, and 230 and is parallel to the y direction.

The first lens retaining recesses 1a to 1c are formed to have the sizes that enable movement of the first lens portions 10, 20, and 30 such that the positions (optical axes) of the first lens portions 10, 20, and 30 in the x direction and the y direction may be adjusted.

In other words, as illustrated in FIG. 4, the first lens retaining recesses 1a to 1c have sliding surfaces 1aa, 1ba, and 1ca (first surfaces), which are wider than fixing surfaces of the first lens holders 12, 22, and 32 (surfaces on the semiconductor lasers 210, 220, and 230 sides (first fixing surfaces)) which are fixed to the first lens retaining recesses 1a to 1c, on wall surfaces on the semiconductor lasers 210, 220, and 230 sides.

As illustrated in FIG. 5, in the respective sliding surfaces 1aa, 1ba, and 1ca of the first lens retaining recesses 1a to 1c, step portions 1ab, 1bb, and 1cb are respectively provided to upper ends and lower ends. The step portions 1ab, 1bb, and 1cb are formed as parts onto which a protrusion (such as a rod or a pin), which is not illustrated, is pressed so as to detach the housing 1 from a substrate or the like on which the housing 1 is mounted. Accordingly, in a case where work for the housing 1 is requested after mounting of the housing 1, the housing 1 may easily be detached. Further, the step portions 1ab, 1bb, and 1cb may be used as portions for facilitating insertion of a needle (particularly, a needle tip) to the sliding surfaces 1aa, 1ba, and 1ca, the needle for applying an adhesive for fixing the first lens portions 10, 20, and 30 to the sliding surfaces 1aa, 1ba, and 1ca, or may be used as portions into which the adhesive is poured.

The second lens retaining recesses 1d to 1f are recesses that are provided for respectively retaining the second lens portions 110, 120, and 130. The second lens retaining recesses 1d to 1f are open on lower surface sides as illustrated in FIG. 2C and FIG. 3. The second lens retaining recesses 1d to 1f communicate with the composite prism retaining recess 1g. Further, the second lens retaining recesses 1d to 1f are formed symmetrically with respect to the plane, which includes the optical axes of the semiconductor lasers 210, 220, and 230 and is parallel to the y direction. However, the second lens retaining recesses 1d to 1f may be formed asymmetrically with respect to the plane.

As illustrated in FIG. 5, the second lens retaining recess 1d has a pair of inclined support surfaces 1da, the second lens retaining recess 1e has a pair of inclined support surfaces 1ea, and the second lens retaining recess 1f has a pair of inclined support surfaces 1fa. The inclined support surface 1da is a surface that is inclined from a lower end of a vertical surface of the second lens retaining recess 1d toward a lower end surface of the housing 1. The inclined support surface 1ea is a surface that is inclined from a lower end of a vertical surface of the second lens retaining recess 1e toward a lower end surface of the housing 1. The inclined support surface 1fa is a surface that is inclined from a lower end of a vertical surface of the second lens retaining recess 1f toward a lower end surface of the housing 1.

The pair of inclined support surfaces 1da (second surfaces) are provided while an open lower end portion of the second lens retaining recess 1d is interposed between the pair of the inclined support surfaces 1da and thereby slidably support the second lens portion 110 in the direction of the optical axis of the semiconductor laser 210 (the z direction). The pair of inclined support surfaces 1ea (second surfaces) are provided while an open lower end portion of the second lens retaining recess 1e is interposed between the pair of inclined support surfaces 1ea and thereby slidably support the second lens portion 120 in the direction of the optical axis of the semiconductor laser 220 (the z direction). The pair of inclined support surfaces 1fa (second surfaces) are provided while an open lower end portion of the second lens retaining recess 1f is interposed between the pair of inclined support surfaces 1fa and thereby slidably support the second lens portion 130 in the direction of the optical axis of the semiconductor laser 230 (the z direction).

The second lens retaining recesses 1d to 1f (the inclined support surfaces 1da, 1ea, and 1fa) are respectively formed to have the lengths that enable movement of the second lens portions 110, 120, and 130 such that the positions of the second lens portions 110, 120, and 130 in the z direction may be adjusted. The lengths of the second lens retaining recesses 1d to 1f are respectively different in accordance with the wavelengths of the semiconductor lasers 210, 220, and 230. Further, the second lens retaining recesses 1d to 1f have the inclined support surfaces 1da, 1ea, and 1fa as wider surfaces (second surfaces) than fixing surfaces of second lens holders 112, 122, and 132, which are fixed to the second lens retaining recesses 1d to 1f.

<Configuration of First Lens Portions>

As illustrated in FIG. 2B, the first lens portions 10, 20, and 30 respectively have first lenses 11, 21, and 31, the first lens holders 12, 22, and 32, and first lens apertures 13, 23, and 33.

The first lenses 11, 21, and 31 have a function of making incident light parallel light and of emitting the parallel light. The first lenses 11, 21, and 31 are plano-convex lenses formed of glass. The first lenses 11, 21, and 31 may be formed of a material that has a desired lens function (such as glass or plastic). Further, the first lenses 11, 21, and 31 may be cylindrical lenses in which spherical surfaces are formed in vertical directions with respect to the optical axes of the semiconductor lasers 210, 220, and 230, cylindrical lenses in which spherical surfaces are formed in parallel directions with respect to the optical axes, or aspheric lenses with low optical aberration.

In a case where the first lenses 11, 21, and 31 are configured with the cylindrical lenses, it is preferable that spherical surface functions are different with respect to selected light incident surfaces of second lenses 111, 121, and 131, which will be described later. For example, in a case where the first lenses 11, 21, and 31 are the cylindrical lenses in which the spherical surfaces are formed in the vertical directions with respect to light emission surfaces, the second lenses 111, 121, and 131 are cylindrical lenses in which the spherical surfaces are formed in parallel directions with respect to the light emission surfaces.

The first lens holders 12, 22, and 32 (first lens retaining bodies) are retaining members that respectively retain the first lenses 11, 21, and 31. The first lens holders 12, 22, and 32 are shaped in octagons when seen from the directions of the optical axes. As illustrated in FIG. 2D, the first lens holder 22 retains the first lens 21 so as to surround a periphery of the first lens 21 and exposes the first lens 21 on the incident side and the emission side of light of the first lens 21. The first lens holders 12 and 32 are configured to similarly retain the first lenses 11 and 31.

Note that each of the first lenses 11, 21, and 31 and each of the first lens holders 12, 22 and 32 are formed as separate bodies. Although not limited to this, the first lens portions 10, 20, and 30 may be portions in which the first lenses 11, 21, and 31 are integrally formed with the first lens holders 12, 22, and 32 by glass, a resin, or the like.

The first lens apertures 13, 23, and 33 are respective opening members that are provided for cutting undesired components such as stray light that is included in the light emitted from the first lenses 11, 21, and 31. The first lens apertures 13, 23, and 33 are plate members that are formed of a resin or metal and are provided with light passing holes for making the laser light pass at centers. The first lens apertures 13, 23, and 33 are formed as separate bodies from the first lens holders 12, 22 and 32. Accordingly, the positions may be adjusted after the first lenses 11, 21, and 31 are respectively mounted on the first lens holders 12, 22, and 32. Further, because the first lens apertures 13, 23, and 33 are exchangeable for the first lens apertures 13, 23, and 33 whose light passing holes have different diameters, the diameter of the light passing hole may easily be changed.

The first lens apertures 13, 23, and 33 are not limited to such structures but may integrally be formed with the respective first lens holders 12, 22 and 32 together with lens functions by resin formation or the like.

<Configuration of Second Lens Portions>

Figure 6A:
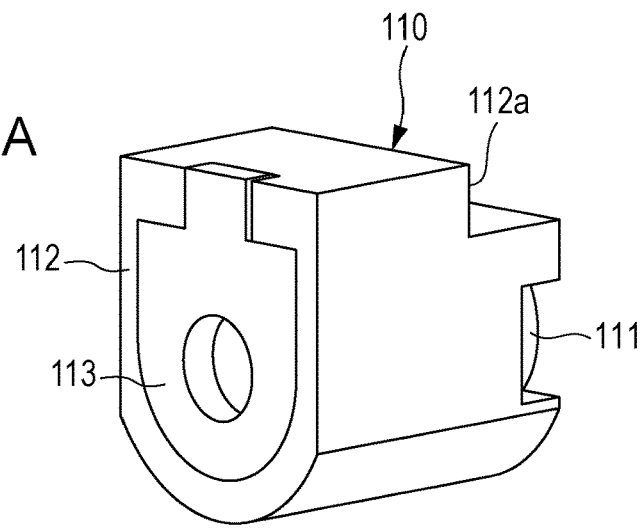
FIG. 6A is a perspective diagram that illustrates an external appearance of a second lens portion.
Figure 6B:
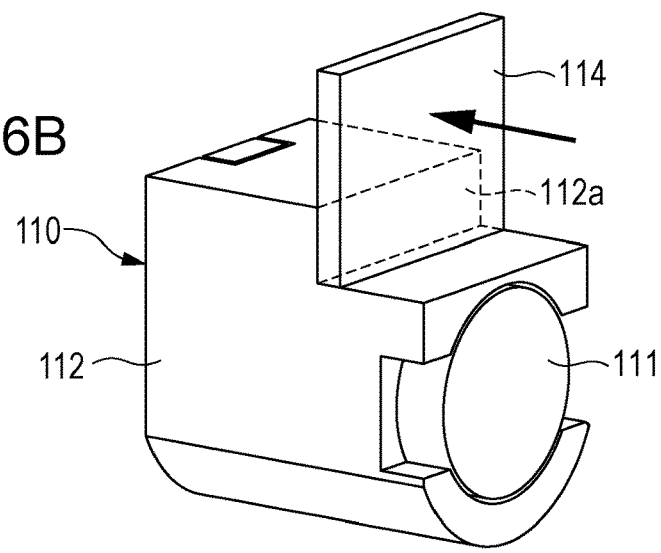
FIG. 6B is a perspective diagram that illustrates another external appearance of the second lens portion.
Figure 7:
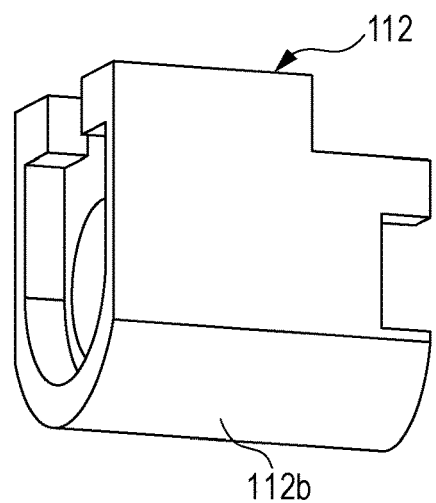
FIG. 7 is a perspective diagram that illustrates a configuration of the second lens holder.

FIG. 6A is a perspective diagram that illustrates an external configuration of the second lens portion 110. FIG. 6B is a perspective diagram that illustrates another external appearance of the second lens portion 110. FIG. 7 is a perspective diagram that illustrates a configuration of the second lens holder 112.

As illustrated in FIG. 2C and FIG. 6A, the second lens portions 110, 120, and 130 respectively have the second lenses 111, 121, and 131, the second lens holders 112, 122, and 132, and second lens apertures 113, 123, and 133. Note that FIG. 6A only illustrates the second lens portion 110. The second lens holder 112 has a vertical surface 112a, which is vertical to the direction of the optical axis of the semiconductor laser 210, on an upper surface of the second lens holder 112. Further, as illustrated in FIG. 6B, the second lens portion 110 presses a pressing plate 114 onto the vertical surface 112a, and the force for moving the second lens portion 110 is thereby given. Although not illustrated, the second lens holders 122 and 132 have the same vertical surfaces as the vertical surface 112a.

The second lenses 111, 121, and 131 have a function of making incident light parallel light and of emitting the parallel light. The second lenses 111, 121, and 131 are plano-convex lenses formed of glass. The second lenses 111, 121, and 131 may be formed of a material that has a desired lens function (such as glass or plastic). Further, as described above, for example, in a case where the first lenses 11, 21, and 31 are the cylindrical lenses in which the spherical surfaces are formed in the vertical directions with respect to the light emission surfaces, the cylindrical lenses in which the spherical surfaces are formed in parallel directions with respect to the light emission surfaces may be used for the second lenses 111, 121, and 131.

The second lens holders 112, 122, and 132 (second lens retaining bodies) are retaining members that respectively retain the second lenses 111, 121, and 131. As illustrated in FIG. 2D, the second lens holder 122 retains the second lens 121 so as to surround a periphery of the second lens 121 on one end side (the first lens holder 12 side) and exposes the second lens 121 on the incident side and the emission side of light of the second lens 121. Further, in the second lens holder 122, a cylindrically shaped internal space is formed between an end portion that retains the second lens 121 and an end portion (an end portion on the light emission side) of the opposite side. The second lens holders 112 and 132 are configured to similarly retain the second lenses 111 and 131 and have internal spaces.

As illustrated in FIG. 7, a bottom surface 112b of the second lens holder 112 is formed into a shape (semi-cylindrical shape) like a cylinder having the optical axis of the semiconductor laser 210 as the center, which is divided along the optical axis. The bottom surface 112b that has such a shape contacts with the pair of inclined support surfaces 1da along the pair of inclined support surfaces 1da, and the second lens holder 112 is supported slidably on the inclined support surfaces 1da. The length of the bottom surface 112b is preferably as long as possible in order to stabilize a sliding action on the inclined support surfaces 1da or to inhibit a turnover of the second lens holder 112. Further, the pair of inclined support surfaces 1da are fixed to a surface (the above-described fixing surface (second fixing surface)) of the bottom surface 112b, which is opposed to the pair of inclined support surfaces 1da.

Although not illustrated, the second lens holders 122 and 132 have the same bottom surfaces as the bottom surface 112b. Accordingly, the second lens holders 122 and 132 are respectively supported by the pairs of inclined support surfaces 1ea and 1fa slidably and are fixed to the inclined support surfaces 1ea and 1fa on the bottom surfaces.

Note that each of the second lenses 111, 121, and 131 and each of the second lens holders 112, 122 and 132 are formed as separate bodies. Although not limited to this, the second lens portions 110, 120, and 130 may be portions in which the second lenses 111, 121, and 131 are integrally formed with the second lens holders 112, 122, and 132 by glass, a resin, or the like.

The second lens apertures 113, 123, and 133 are respective opening members that are provided for cutting the light emitted from the second lenses 111, 121, and 131 such that the light has a prescribed diameter. The second lens apertures 113, 123, and 133 may realize a provision of a light emission point size, suppression of color unevenness of light, stray light suppression, and so forth by such a light cutting function.

As illustrated in FIG. 2C and FIG. 6A, the second lens apertures 113, 123, and 133 are provided in end portions in the second lens holders 112, 122, and 132 on the light emission side.

<Lower End Portion Structure of First Lens Retaining Recess>

Figure 8:
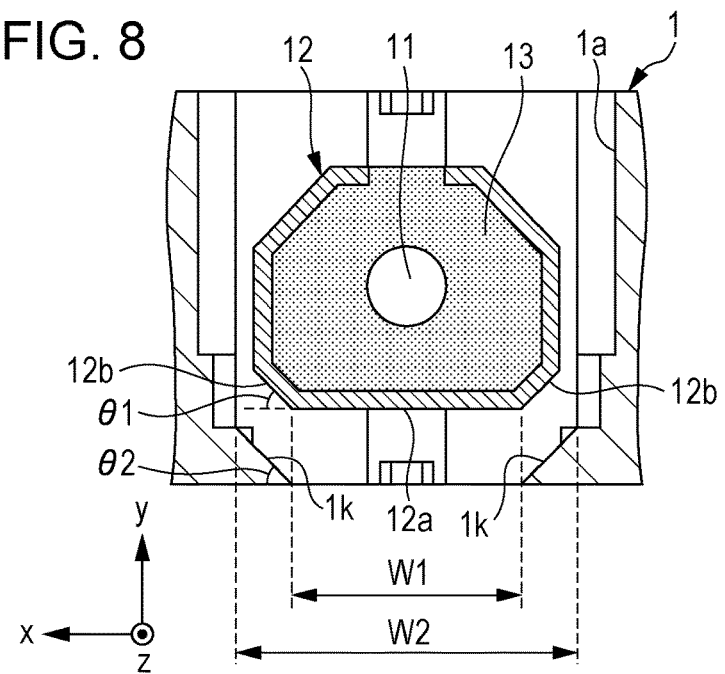
FIG. 8 is a principal portion cross-sectional diagram that illustrates the structural relationship between the first lens holder which is arranged in the light source device and a first lens retaining recess of the housing.

FIG. 8 is a principal portion cross-sectional diagram that illustrates the structural relationship between the first lens holder 12 which is arranged in the light source device 100 and the first lens retaining recess 1a of the housing 1.

Lower ends of the first lens retaining recesses 1a to 1c are open, but the first lens retaining recesses 1a to 1c have structures that may respectively retain the first lens portions 10, 20, and 30 in the positions of a lower end of the housing 1. The structure will be described in the following. Note that in the description in the following, for convenience of description, the description will be made while illustrating the first lens holder 12 of the first lens portion 10.

As illustrated in FIG. 8, the first lens holder 12 has a bottom surface 12a and two inclined surfaces 12b that are provided on both sides of the bottom surface 12a. The inclined surface 12b is inclined at a first inclination angle θ1 with respect to the horizontal plane (including the bottom surface 12a).

Meanwhile, a pair of inclined surfaces 1k (opposed surfaces) that are formed in lower portions of the first lens retaining recess 1a are formed to face the inclined surfaces 12b in the y direction. The inclined surface 1k is inclined at a second inclination angle θ2 with respect to the horizontal plane (including a bottom surface of the housing 1) so as to support a lower portion of the first lens holder 12. Further, a bottom portion width W1 (the width between lower ends of the pair of inclined surfaces 1k) of a bottom portion (open portion) of the first lens retaining recess 1a is equivalent to the width of the bottom surface 12a of the first lens holder 12.

In a case where the first lens holder 12 moves in the opposite direction to the y direction in position adjustment of the first lens 11, the inclined surfaces 12b of the first lens holder 12 abut the inclined surfaces 1k of the housing 1, further movement is thereby restrained, and the first lens holder 12 is retained on the inclined surfaces 1k. Accordingly, the first lens holder 12 is inhibited from falling from the lower end of the first lens retaining recess 1a.

Here, as described above, the bottom portion width W1 is equivalent to the width of the bottom surface 12a, and an upper portion width W2 is wider than the bottom portion width W1 (W1<W2). Further, the first inclination angle θ1 is equivalent to the second inclination angle θ2 (θ1=θ2). For example, as the values of the bottom portion width W1, the upper portion width W2, the first inclination angle θ1, and the second inclination angle θ2, W1=3.0 mm, W2=4.4 mm, θ1=45°, and θ2=45° are raised, respectively. It is matter of course that the values of the bottom portion width W1, the upper portion width W2, the first inclination angle θ1, and the second inclination angle θ2 are not limited to the above specific values.

The relationship between the lower portion of the first lens retaining recess 1a and the first lens holder 12 is defined in such a manner, and the first lens holder 12 is retained at the lower end of the first lens retaining recess 1a. Thus, the following two advantages may be obtained as a result.

First, the range in which the first lens holder 12 may move for position adjustment in the first lens retaining recess 1a may be maximized.

Instead of such a structure, the width of the first lens retaining recess 1a is made substantially equivalent to the width of the first lens holder 12, and the first lens holder 12 may thereby be inhibited from jutting out from the lower end of the first lens retaining recess 1a. However, because the width of the first lens retaining recess 1a in the x direction becomes narrow, it becomes difficult to perform the position adjustment of the first lens holder 12. Thus, because the adjustment range of a beam azimuthal direction of the first lens 11 becomes narrow, the beam azimuthal direction of the first lens 11 may not largely be adjusted.

Second, in a course in which the first lens holder 12 is temporarily moved down to the lower end of the first lens retaining recess 1a, the first lens holder 12 is guided to a defined position (reference position) of the lower end such that the inclined surfaces 12b of the first lens holder 12 contact with the inclined surfaces 1k of the first lens retaining recess 1a. The reference position is a position that serves as a reference when the optical axis of the first lens 11 is adjusted. Accordingly, as illustrated in FIG. 8, the bottom surface 12a of the first lens holder 12 may be returned to a provided position in the x direction, for example, to a coordinate zero of the x axis.

Consequently, the position adjustment of the first lens holder 12 may be performed by coarse adjustment only in the y direction. Fine adjustment is performed in the x direction and the y direction after the coarse adjustment, and the adjustment time may thereby be shortened. Further, even in a case where the position of the first lens holder 12 is not clearly understood in the adjustment by an inexperienced operator, the adjustment may easily be restarted by returning the first lens holder 12 to the reference position of the lower end of the first lens retaining recess 1a.

Note that although the relationships between the first lens holder 22 and the first lens retaining recess 1b and between the first lens holder 32 and the first lens retaining recess 1c are not illustrated, the structural relationship between the first lens holder 12 and the first lens retaining recess 1a of the housing 1 as illustrated in FIG. 8 is present.

<Effects of Embodiment>

The light source device 100 according to this embodiment includes the housing 1 that has the first lens retaining recesses 1a to 1c and the second lens retaining recesses 1d to 1f. The first lens retaining recesses 1a to 1c have the sliding surfaces 1aa, 1ba, and 1ca, which are wider than the fixing surfaces of the first lens holders 12, 22, and 32 which are fixed to the first lens retaining recesses 1a to 1c. Further, the second lens retaining recesses 1d to 1f have the wider inclined support surfaces 1da, 1ea, and 1fa than the fixing surfaces of the second lens holders 112, 122, and 132, which are fixed to the second lens retaining recesses 1d to 1f.

Accordingly, the first lens holders 12, 22, and 32 are caused to move along the sliding surfaces 1aa, 1ba, and 1ca, and the positions of the first lenses 11, 21, and 31 in the x direction and the y direction may thereby be adjusted. Further, the second lens holders 112, 122, and 132 are caused to slide along the inclined support surfaces 1da, 1ea, and 1fa, and the positions of the second lenses 111, 121, and 131 in the z direction may thereby be adjusted.

In a case where the positions of the first lenses 11, 21, and 31 are adjusted, the first lens holders 12, 22, and 32 are fixed to the positions by the adhesive. In a case where the positions of the second lenses 111, 121, and 131 are adjusted, the second lens holders 112, 122, and 132 are fixed to the positions by the adhesive.

Accordingly, offsets of the positions in the z direction that occur due to shrinkage by curing of the adhesive after the position adjustment of the first lenses 11, 21, and 31, offsets of the positions in the x direction and the y direction that occur due to shrinkage by curing of the adhesive after the position adjustment of the second lenses 111, 121, and 131, or the like may be inhibited. Thus, influences on the positions in the directions, which are not related to the respective position adjustment directions of the first lenses 11, 21, and 31 and the second lenses 111, 121, and 131, may be avoided. Accordingly, compared to a method in which the position of a lens is adjusted in the three-dimensional directions and the lens is thereafter fixed by an adhesive like a light source device in related art which has only one lens for one semiconductor laser, the influences on the positions due to curing shrinkage of the adhesive, which occur in any of the three-dimensional directions of the lens, may be reduced.

Thus, a highly reliable light source device may be provided in which relative optical axis offsets of plural small-sized lasers including desired convergence and divergence characteristics are less likely to occur.

[Second Embodiment]

A second embodiment of the present disclosure will be described in the following based on FIG. 4 to FIG. 6B and FIG. 9 to FIG. 13B. Note that for convenience of description, the same reference characters will be given to members that have the same functions as the members described in the first embodiment, and a description thereof will not be made.

<Manufacturing Method of Light Source Device>

In this embodiment, a manufacturing method of the light source device 100 will be described.

First, the semiconductor lasers 210, 220, and 230 are mounted on the housing 1. Here, in a state where the semiconductor lasers 210, 220, and 230 are fitted in the housing 1 and the semiconductor lasers 210, 220, and 230 are held by the laser holder 2, the fixing spring 3 that covers a periphery of the laser holder 2 is fixed to the housing 1 by screw fastening.

Next, the composite prism 4 is arranged in the composite prism retaining recess 1g and fixed by the adhesive. Fixing of the composite prism 4 may be performed earlier than mounting of the semiconductor lasers 210, 220, and 230.

In this state, the first lens portions 10, 20, and 30 are respectively arranged in the first lens retaining recesses 1a, 1b, and 1c of the housing 1. Further, the second lens portions 110, 120, and 130 are respectively arranged in the second lens retaining recesses 1d, 1e, and 1f of the housing 1. Accordingly, in the housing 1, the first lens portions 10, 20, and 30 and the second lens portions 110, 120, and 130 are respectively arranged in the positions that allow the emitted light from the semiconductor lasers 210, 220, and 230 to pass. Further, in order of closeness to the semiconductor lasers 210, 220, and 230, the first lens portions 10, 20, and 30 and the second lens portions 110, 120, and 130 are arranged.

In addition, the first lens portions 10, 20, and 30 are moved respectively in the first lens retaining recesses 1a to 1c, and the optical axes of the first lenses 11, 21, and 31 are thereby adjusted (a first lens optical axis adjusting process). Then, the first lens portions 10, 20, and 30 are fixed by the adhesive to the adjusted positions in the first lens retaining recesses 1a to 1c (a first lens fixing process).

Further, the second lens portions 110, 120, and 130 are moved respectively in the second lens retaining recesses 1d to 1f, and the spot sizes of the beams emitted from the second lenses 111, 121, and 131 are thereby adjusted (a beam convergence-divergence adjusting process by a second lens). Then, the second lens portions 110, 120, and 130 are fixed by the adhesive to the adjusted positions in the second lens retaining recesses 1d to 1f (a second lens fixing process).

The adjustment of the lens positions are performed as follows. First, in a state where the semiconductor lasers 210, 220, and 230 are lit, the positions of the first lenses 11, 21, and 31 are coarsely adjusted in the y direction and are thereby aligned to the emission positions of the laser light. Subsequently, the positions of the second lenses 111, 121, and 131 are adjusted, and the beam spot sizes of the laser light are thereby adjusted. In addition, the positions of the first lenses 11, 21, and 31 are finely adjusted, and the azimuthal directions of the laser light are thereby adjusted. This adjustment may reduce relative offsets of the optical axes of plural beams of laser light, which are the respective beams of laser light emitted from the second lenses 111, 121, and 131 which are multiplexed by the composite prism 4. Accordingly, relative angular offsets of the multiplexed beams of laser light may easily be adjusted by adjustment of the first lenses 11, 21, and 31 in the x direction and the y direction.

The position adjustment of the first lenses 11, 21, and 31 and the position adjustment of the second lenses 111, 121, and 131 are not limited to the above procedure, but either one may be performed first, or both of those may simultaneously be performed.

In such a manner, the light source device 100 is manufactured.

Note that because the first lens portions 10, 20, and 30 are directly fixed to the housing 1 (the sliding surfaces 1aa, 1ba, and 1ca of the first lens retaining recesses 1a to 1c), the respective fixing surfaces of the first lens holders 12, 22, and 32 are in substantially vertical directions with respect to the emission directions of the laser light. Thus, heat of the laser light is likely to be transmitted to the first lens portions 10, 20, and 30, and the adhesion of the adhesive are thus influenced. Accordingly, to avoid direct contact with the housing 1, a material with lower thermal conductivity than the housing 1 is inserted between the housing 1 and the first lens portions 10, 20, and 30. Accordingly, an influence of the heat is reduced, and the influence of the heat on the adhesion of the adhesive may thereby be reduced.

<Position Adjustment of First Lenses>

Next, the position adjustment (the optical axis adjusting process) of the first lenses 11, 21, and 31 will be described in detail.

Figure 9:
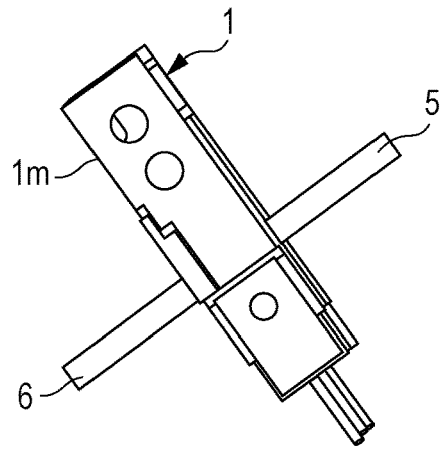
FIG. 9 is a perspective diagram that illustrates a posture of the housing in a lens adjustment method according to a second embodiment of the present disclosure.
Figure 10:
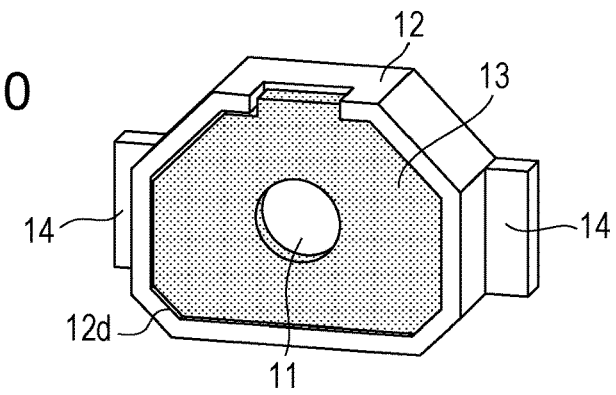
FIG. 10 is a perspective diagram that illustrates an external configuration of the first lens holder which is preferable for the lens adjustment method according to the second embodiment.
Figure 12A:
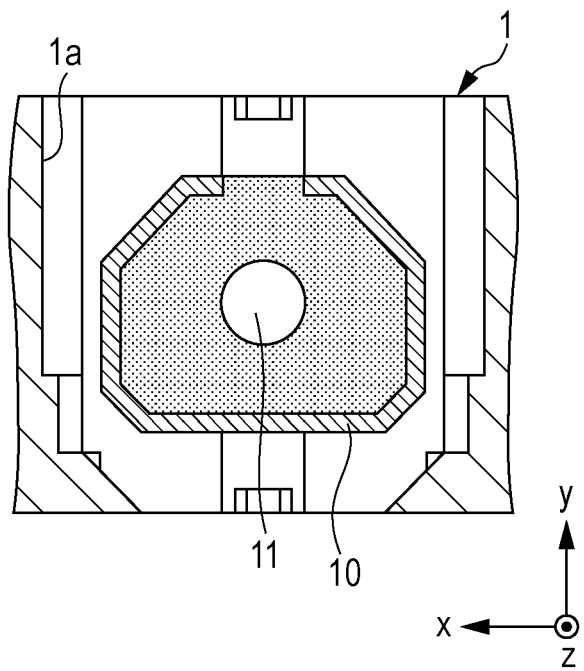
FIG. 12A is a principal portion cross-sectional diagram that illustrates a state where the first lens holder is moved.
Figure 12B:
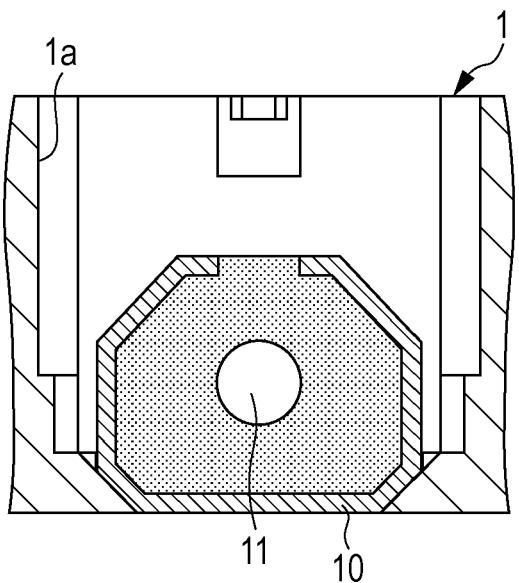
FIG. 12B is a principal portion cross-sectional diagram that illustrates a state where the first lens holder is returned to a reference position.
Figure 13A:
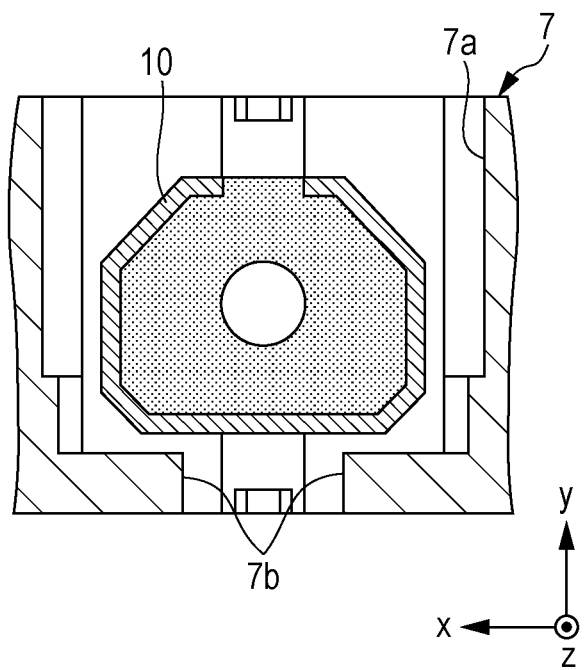
FIG. 13A is a principal portion cross-sectional diagram that illustrates a first lens holder retaining structure which is used in the second embodiment.
Figure 13B:
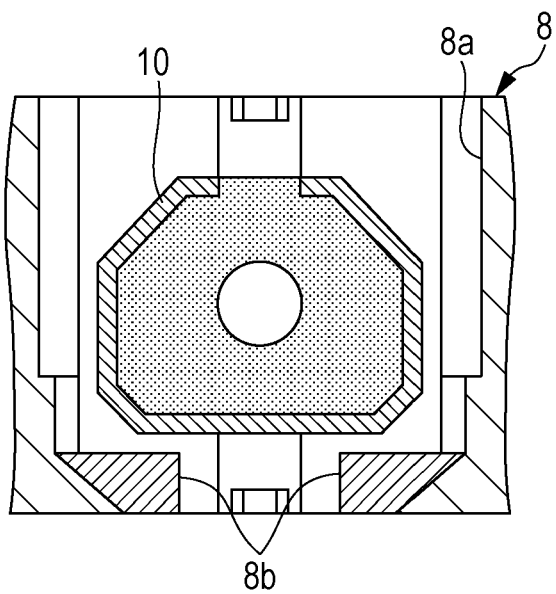
FIG. 13B is a principal portion cross-sectional diagram that illustrates another first lens holder retaining structure which is used in the second embodiment.

FIG. 9 is a perspective diagram that illustrates the posture of the housing 1 in a lens adjustment method according to the second embodiment. FIG. 10 is a perspective diagram that illustrates an external configuration of the first lens holder 12 which is preferable for the lens adjustment method. FIG. 11A is a principal portion cross-sectional diagram that illustrates a state where a chucking mechanism 5 and a clamping mechanism 6 retain the first lens holder 12. FIG. 11B is a principal portion cross-sectional diagram that illustrates a state where the chucking mechanism 5 and the clamping mechanism 6 move the first lens holder 12. FIG. 12A is a principal portion cross-sectional diagram that illustrates a state where the first lens holder 12 is moved. FIG. 12B is a principal portion cross-sectional diagram that illustrates a state where the first lens holder 12 is returned to the reference position. FIG. 13A is a principal portion cross-sectional diagram that illustrates a first lens holder retaining structure which is used in this embodiment. FIG. 13B is a principal portion cross-sectional diagram that illustrates another first lens holder retaining mechanism which is used in this embodiment.

The position adjustment of the first lenses 11, 21, and 31 may be performed in a state where the bottom surface of the housing 1 is parallel to the horizontal plane but may be performed in a state where the housing 1 is inclined with respect to the horizontal plane as illustrated in FIG. 9 or may be performed in a state where the housing 1 is vertically stood with respect to the horizontal plane. In a case where the housing 1 is inclined with respect to the horizontal plane, the inclination angle is 30° or more to less than 90°.

Hereinafter, as a representative, the position adjustment of the first lens 11 will be described. The position adjustment of the other first lenses 21 and 31 will not be described but is performed similarly to the position adjustment of the first lens 11.

First, the first lens portion 10 is arranged in the first lens retaining recess 1a. Here, the fixing surface of the first lens holder 12 in the first lens portion 10 (the surface on the semiconductor laser 210 side), which is fixed to the first lens retaining recess 1a, is pressed onto the sliding surface 1aa illustrated in FIG. 4. Here, the housing 1 is inclined or stood vertically, and the first lens holder 12 thereby falls toward the sliding surface 1aa side because the gravity is exerted on the first lens holder 12.

Further, the first lens holder 12 is pressed onto the sliding surface 1aa by a jig such as a spring or a pressing rod. Alternatively, as illustrated in FIG. 10, one abutting plate 14 is provided to each of both side end surfaces of the first lens holder 12, springs are pressed onto those abutting plates 14, and the first lens holder 12 may thereby be pressed onto the sliding surface 1aa by the springs. By pressing in such a manner, the movement of the first lens holder 12 in the z direction may be inhibited, and adjustment may thereby be performed stably.

In this state, while the semiconductor laser 210 is lit, the first lens holder 12 is arranged in the reference position illustrated in FIG. 11A. In the reference position (reset position), the bottom surface 12a of the first lens holder 12 and the bottom surface of the housing 1 are present in the same plane, and the position of the first lens holder 12 in the x coordinate becomes zero.

From this state, as illustrated in FIG. 11A, inclined surfaces 12c on both sides in an upper portion of the first lens holder 12 are held by a pair of chucking surfaces 5a of the chucking mechanism 5 from an upper direction, and the bottom surface 12a of the first lens holder 12 is held by the clamping mechanism 6 from a lower direction. Then, as illustrated in FIG. 11B, in a state where the first lens holder 12 is held down such that the first lens holder 12 is not offset, the chucking mechanism 5 and the clamping mechanism 6 are moved in the y direction (arrow direction), and the chucking mechanism 5 and the clamping mechanism 6 are further moved in the x direction.

In such a manner, the first lens portion 10 is caused to move in a state where the first lens portion 10 is pressed onto the sliding surface 1aa, and the position of the first lens 11 in the y direction and the x direction are thereby adjusted. The order of the position adjustment in the y direction and the x direction may be opposite to the above. Further, the semiconductor laser 210 keeps being lit while the first lens portion 10 is moved.

Note that it is sufficient that the chucking mechanism 5 and the clamping mechanism 6 have structures in which the first lens holder 12 is held between the chucking mechanism 5 and the clamping mechanism 6. Structures are not limited to the structures illustrated in FIGS. 11A and 11B.

Then, in a case where the azimuthal direction of the laser light is decided when the first lens portion 10 is in the position illustrated in FIG. 12A, the position adjustment (coarse adjustment) of the first lens 11 in the y direction is completed. In a case where this position adjustment is finished improperly and it becomes difficult to continue the position adjustment, the first lens portion 10 is returned to the reference position illustrated in FIG. 12B, and the position adjustment may thereby be restarted.

Note that as examples of other housings 7 and 8, the configurations illustrated in FIGS. 13A and 13B will be described.

In the configuration illustrated in FIG. 13A, a first lens retaining recess 7a is provided to the housing 7. A pair of bottom portions 7b of the first lens retaining recess 7a have a prescribed thickness. Further, a portion between the bottom portions 7b is open. In such a configuration, the first lens portion 10 is placed on the bottom portions 7b. Thus, the first lens portion 10 may not approach a bottom surface of the housing 7 any more.

Meanwhile, in the configuration illustrated in FIG. 13B, a first lens retaining recess 8a is provided to the housing 8. A pair of bottom portions 8b of the first lens retaining recess 8a partially have inclined surfaces but have portions that have a prescribed thickness. Further, a portion between the bottom portions 8b is open. In such a configuration also, the first lens portion 10 is placed on the bottom portions 8b. Thus, the first lens portion 10 may not approach a bottom surface of the housing 8 any more.

In such a manner, in the above configurations, because movable regions of the first lens portion 10 in the y direction are narrow, the position adjustment ranges in the y direction are narrow. Thus, in a case where the thicknesses (the sizes in the y direction) of the housings 7 and 8 are lessened in order to make the light source device thin, the position adjustment ranges in the y direction become narrower.

However, in the light source device 100 according to the first and second embodiments, the movable region of the first lens portion 10 may be expanded to the bottom surface of the housing 1. Accordingly, even in a case where the thickness of the housing 1 becomes thin by making the light source device 100 thin, the position adjustment range in the y direction may be secured widely.

<Position Adjustment of Second Lenses>

Adjustment of the spot sizes of the beams emitted from the second lenses 111, 121, and 131 (the beam convergence-divergence adjusting process) is different from the adjustment of the first lenses 11, 21, and 31 and is performed in a state where the bottom surface of the housing 1 is parallel to the horizontal plane.

First, the second lens portions 110, 120, and 130 are respectively arranged in the second lens retaining recesses 1d to 1f. Here, the second lens portions 110, 120, and 130 are arranged such that the bottom surfaces in the second lens holders 112, 122, and 132 respectively contact with the inclined support surfaces 1da, 1ea, and 1fa illustrated in FIG. 5.

In this state, the second lens portions 110, 120, and 130 are moved in the z direction. Here, in the second lens portion 110, the pressing plate 114 illustrated in FIG. 6B is caused to abut the vertical surface 112a and pushed in the arrow direction, and the second lens portion 110 may thereby be moved. Similarly, the second lens portions 120 and 130 are moved. Accordingly, the second lens portions 110, 120, and 130 respectively slide on the inclined support surfaces 1da, 1ea, and 1fa.

In this embodiment, the first lens portions 10, 20, and 30 that are close to light sources are caused to have an optical axis adjustment function, and the second lens portions 110, 120, and 130 that are far from the light sources are caused to have a beam convergence-divergence adjustment function. The adjustment functions are distributed to the first lens portions 10, 20, and 30 and the second lens portions 110, 120, and 130 in such a manner because sensitivity may be moderated and easily be adjusted in a case where the optical axis adjustment is performed by the first lenses 11, 21, and 31 that are closer to the light sources than the second lenses 111, 121, and 131. However, the first lens portions 10, 20, and 30 may be caused to have the beam convergence-divergence adjustment function, and the second lens portions 110, 120, and 130 may be caused to have the optical axis adjustment function.

<Adjustment of Relative Offsets of Plural Optical Axes>

The beams of laser light emitted from the second lens portions 110, 120, and 130 are multiplexed by the composite prism 4. In a case where the optical axes of the plural beams of laser light that are multiplexed are relatively offset, for example, only the first lens portion 10 is again slid in the x direction or the y direction. In such a manner, the optical axis adjustment of the first lenses 11, 21, and 31 is again performed, and the adjustment may thereby be performed such that relative offsets of the optical axes of the plural beams of laser light that are multiplexed are removed. In this adjustment, because the second lens portions 110, 120, and 130 do not have to be again adjusted, simpler and highly precise adjustment is possible.

<Inhibition of Collision Between First Lens Portions and Second Lens Portions>

In the light source device 100, in order to obtain a desired light emission point that is requested in the market, respective pairs of lenses, which are the first lenses 11, 21, and 31 and the second lenses 111, 121, and 131, are used for the respective semiconductor lasers 210, 220, and 230. Thus, it is assumed that the distances between emission surfaces of the first lens portions 10, 20, and 30 and corresponding incident surfaces of the second lens portions 110, 120, and 130 are highly possibly 1 mm or less. In a case where the distance is 1 mm or less, a mutual collision possibly occur when the first lens portions 10, 20, and 30 slide on the second lens portions 110, 120, and 130. In order to avoid respective contacts between the second lenses 111, 121, and 131 and the first lens portions 10, 20, and 30 due to such a collision, the light source device 100 employs a structure described in the following.

End surfaces (first end surfaces) of the first lens holders 12, 22, and 32 on the light emission side are respectively provided at prescribed intervals in the z direction from top portions of convex surfaces (surfaces on the light emission side) of the first lenses 11, 21, and 31. In regions of the prescribed intervals, the first lens apertures 13, 23, and 33 are arranged in positions withdrawn from the end surfaces of the first lens holders 12, 22, and 32 on the light emission side toward the light incident side. Accordingly, steps are formed between end surfaces of the first lens apertures 13, 23, and 33 on the light emission side and the end surfaces of the first lens holders 12, 22 and 32, which protrude from the respective end surface of the first lens apertures 13, 23, and 33 toward the light emission side.

Specifically, as illustrated in FIG. 10, a step 12*d* is formed between the end surface of the first lens aperture 13 on the light emission side and the end surface of the first lens holder 12, which protrudes from the end surface of the first lens aperture 13 toward the light emission side. Further, as illustrated in FIG. 2D, a step 22*d* is formed between the end surface of the first lens aperture 23 on the light emission side and the end surface of the first lens holder 22, which protrudes from the end surface of the first lens aperture 23 toward the light emission side. Although not illustrated, a step is formed between the end surface of the first lens aperture 33 on the light emission side and the end surface of the first lens holder 32, which protrudes from the end surface of the first lens aperture 33 toward the light emission side.

Meanwhile, end surfaces (second end surfaces) of the second lens holders 112, 122, and 132 on the light incident side are formed to be respectively opposed to the end surfaces of the first lens holders 12, 22, and 32 on the light emission side. Further, flat surfaces of the second lenses 111, 121, and 131 on the light incident side are formed to be respectively opposed to the end surfaces of the first lens apertures 13, 23, and 33 on the light emission side.

In such a structure, even in a case where a collision occurs when the first lens portions 10, 20, and 30 slide on the respective second lens portions 110, 120, and 130, the end surfaces of the second lens holders 112, 122, and 132 on the light incident side respectively collide with the end surfaces of the first lens holders 12, 22 and 32 on the light emission side. However, because the first lens apertures 13, 23, and 33 are in the positions withdrawn from the end surfaces of the first lens holders 12, 22, and 32 on the light incident side toward the light incident side, the second lenses 111, 121, and 131 do not contact with the first lens apertures 13, 23, and 33.

Note that in the above structure, the steps are provided to the first lens portions 10, 20, and 30. However, steps may be provided to the second lens portions 110, 120, and 130. Further, the steps may be provided to both of the first lens portions 10, 20, and 30 and the second lens portions 110, 120, and 130. Here, the steps in the second lens portions 110, 120, and 130 are formed by respectively arranging the light incident surfaces (flat surfaces) of the second lenses 111, 121, and 131 in the positions withdrawn from the end surfaces of the second lens holders 112, 122, and 132 on the light incident side toward the light emission side.

<Effects of Embodiment>

In the manufacturing method of the light source device 100 according to this embodiment, with respect to the semiconductor lasers 210, 220, and 230, the respective positions are individually adjusted between the first lenses 11, 21, and 31 and the second lenses 111, 121, and 131, and fixing by the adhesive is then performed. Specifically, the first lenses 11, 21 and 31 are fixed after the position adjustment in the x direction and the y direction is performed, and the second lenses 111, 121, and 131 are fixed after the position adjustment in the z direction is performed.

Accordingly, offsets of the positions of the first lenses 11, 21, and 31 in the z direction, which occur due to shrinkage by curing of the adhesive after the position adjustment of the first lenses 11, 21, and 31, may be inhibited. Further, offsets of the positions of the second lenses 111, 121, and 131 in the x direction and the y direction, which occur due to shrinkage by curing of the adhesive after the position adjustment of the second lenses 111, 121, and 131, may be inhibited.

In such a manner, influences on the positions in the directions, which are not related to the respective position adjustment directions of the first lenses 11, 21, and 31 and the second lenses 111, 121, and 131, may be avoided. Accordingly, compared to the method in which the position of the lens is adjusted in the three-dimensional directions and the lens is thereafter fixed by the adhesive like the light source device in related art which has only one lens for one semiconductor laser, the influences on the positions of the lenses due to the curing shrinkage of the adhesive may be reduced. Moreover, the application amount of the adhesive may be decreased compared to the method in related art.

Further, the first lenses 11, 21, and 31 are displaced in the x direction and the y direction, and the beam azimuthal directions of the laser light may thereby be changed. Further, the second lenses 111, 121, and 131 are moved in the z direction, and the beam spot sizes of the laser light may thereby be adjusted. Accordingly, fine adjustment of relative offsets of the optical axes may easily be made in a case where the beams of laser light at respective wavelengths of the semiconductor lasers 210, 220, and 230 are multiplexed and white light is thereby generated.

[Conclusion]

A light source device according to a first aspect of the present disclosure includes: semiconductor lasers 210, 220, and 230; first lens portions 10, 20, and 30; second lens portions 110, 120, and 130; and a housing 1 that retains the semiconductor lasers 210, 220, and 230, the first lens portions 10, 20, and 30, and the second lens portions 110, 120, and 130. The housing 1 has first surfaces (sliding surfaces 1*aa*, 1*ba*, and 1*ca*) to which the first lens portions 10, 20, and 30 are fixed and second surfaces (inclined support surfaces 1*da*, 1*ea*, and 1*fa*) to which the second lens portions 110, 120, and 130 are fixed, the first surfaces are vertical to directions of optical axes of the semiconductor lasers 210, 220, and 230 and wider than first fixing surfaces of the first lens portions 10, 20, and 30 that are fixed to the first surfaces, and the second surfaces are parallel to the directions of the optical axes and wider than second fixing surfaces of the second lens portions 110, 120, and 130 that are fixed to the second surfaces.

In the above configuration, the first lenses may be moved in the vertical directions to the optical axes on the first surfaces for the adjustment of the optical axes of the first lenses, and the second lenses may be moved in the parallel direction to the optical axes on the second surfaces for the adjustment of the spot sizes of the beams emitted from the second lenses. Accordingly, the first lenses and the second lenses may be respectively moved in the different directions between the adjustment of the optical axes of the first lenses and the adjustment of the spot sizes of the beams emitted from the second lenses. Consequently, influences on the positions in the directions, which are not related to the optical axis adjustment directions and the beam spot size adjustment directions, may be avoided. Thus, influences on the positions of the lenses due to the curing shrinkage of the adhesive may be reduced.

As for the light source device according to a second aspect of the present disclosure, in the first aspect, the first lens portions 10, 20, and 30 may be fixed to the first surfaces by an adhesive, and the second lens portions 110, 120, and 130 may be fixed to the second surfaces by an adhesive.

In the above configuration, when the adhesive that fixes the first lenses is cured after the position adjustment of the first lenses, the adhesive mainly shrinks in the z direction but hardly shrinks in the x direction and the y direction. Accordingly, offsets of the optical axes in the curing shrinkage may be inhibited. Further, when the adhesive that fixes the second lenses is cured after the position adjustment of the second lenses, the adhesive mainly shrinks in the y direction but hardly shrinks in the z direction. Accordingly, offsets of the spot sizes of the beams emitted from the second lenses in the curing shrinkage may be inhibited.

As for the light source device according to a third aspect of the present disclosure, in the first or second aspect, the second surfaces may be formed to be parallel with respect to the optical axes and to support the second lens portions 110, 120, and 130.

In the above configuration, the second lens retaining bodies may be moved in the parallel direction with respect to the optical axes in the adjustment of the optical axes of the second lenses.

As for the light source device according to a fourth aspect of the present disclosure, in any one of the first to third aspects, the first lens portions 10, 20, and 30 may have first lenses 11, 21, and 31 and first lens retaining bodies (first lens holder 12, 22, and 32) that retain the first lenses 11, 21, and 31, the second lens portions 110, 120, and 130 may have second lenses 111, 121, and 131 and second lens retaining bodies (second lens holders 112, 122, and 132) that retain the second lenses 111, 121, and 131, first end surfaces of the first lens retaining bodies on a light emission side may be opposed to second end surfaces of the second lens retaining bodies on a light incident side, and the light source device may include at least one of a structure in which optical components which include the first lenses 11, 21, and 31 are arranged in positions withdrawn from the first end surfaces toward the light incident side, and a structure in which optical components which include the second lenses 111, 121, and 131 are arranged in positions withdrawn from the second end surfaces toward the light emission side.

As for the optical components, in a case where the first lens retaining bodies and the second lens retaining bodies are respectively moved for the position adjustment of the first lenses and the second lenses, the first end surfaces of the first lens retaining bodies collide with the second end surfaces of the second lens retaining bodies even if the first lens retaining bodies collide with the second lens retaining bodies. However, the optical components that include the first lenses may avoid contact with the second lens retaining bodies. Further, the optical components that include the second lenses may avoid contact with the first lens retaining bodies.

As for the light source device according to a fifth aspect of the present disclosure, in any one of the first to fourth aspects, the housing 1 may have first lens retaining recesses 1a, 1b, and 1c that include the first surfaces and retain the first lens portions 10, 20, and 30, and the first lens retaining recesses 1a, 1b, and 1c may have opposed surfaces (inclined surfaces 1k) that are opposed to lower portions of the first lens portions 10, 20, and 30.

In the above configuration, the first lens retaining bodies are supported by support surfaces, and the first lens retaining bodies may be retained such that the first lens retaining bodies do not fall from the first lens retaining recesses.

As for the light source device according to a sixth aspect of the present disclosure, in the fifth aspect, the opposed surfaces may be inclined with respect to bottom portions of the housing 1.

In the above configuration, the first lens portions may be guided to the bottom portions of the housing along the inclined surfaces. Accordingly, in a case where the bottom portions of the housing are set as the reference positions of the points of origin of the optical axis adjustment of the first lenses, the first lens portions may be returned to the reference positions. Further, even in a case where the optical axis adjustment of the first lenses is finished improperly, the optical axis adjustment of the first lenses may easily be restarted by returning the first lens portions to the reference positions.

A manufacturing method of a light source device according to a seventh aspect of the present disclosure includes: a first lens optical axis adjusting process of adjusting optical axes of first lenses 11, 21, and 31 with respect to optical axes of semiconductor lasers (210, 220, and 230) by sliding first lens retaining bodies (first lens holders 12, 22, and 32) that retain the first lenses 11, 21, and 31 on first surfaces (sliding surfaces 1aa, 1ba, and 1ca) that are provided to a housing 1; a first lens fixing process of fixing the first lens retaining bodies to the first surfaces; a beam convergence-divergence adjusting process of adjusting spot sizes of beams that are emitted from second lenses 111, 121, and 131 by sliding second lens retaining bodies (second lens holders 112, 122, and 132) that retain the second lenses 111, 121, and 131 on second surfaces (inclined support surfaces 1da, 1ea, and 1fa) that are provided to the housing 1; and a second lens fixing process of fixing the second lens retaining bodies to the second surfaces.

In the above configuration, the adjustment of the optical axes by the first lenses and the adjustment of the beam spot sizes by the second lenses may be performed independently from each other.

In the seventh aspect, the manufacturing method of a light source device according to an eighth aspect of the present disclosure may further include: sliding the first lens retaining bodies on the first surfaces that are vertical with respect to the optical axes in the first lens optical axis adjusting process; and sliding the second lens retaining bodies on the second surfaces that are parallel with respect to the optical axes in the beam convergence-divergence adjusting process.

In the above configuration, the first lenses may be adjusted to the vertical direction to the optical axes in the first lens optical axis adjusting process, and the second lenses may be adjusted to the parallel direction to the optical axes in the beam convergence-divergence adjusting process.

In the seventh or eighth aspect, the manufacturing method of a light source device according to a ninth aspect of the present disclosure may further include: in the first lens optical axis adjusting process, sliding the first lens retaining bodies in a state where the housing 1 is inclined with respect to a horizontal plane or in a state where the housing 1 is arranged vertically with respect to the horizontal plane.

In the above configuration, because the gravity is exerted on the first lens retaining bodies, the first lens retaining bodies may be caused to fall onto the first surfaces. Accordingly, the first lens retaining bodies may easily be slid on the first surfaces.

As for the manufacturing method of a light source device according to a tenth aspect of the present disclosure, in any one of the seventh to ninth aspects, the light source device may include plural semiconductor lasers, and after the first lens optical axis adjusting process and the beam convergence-divergence adjusting process, the first lens optical axis adjusting process may be again performed in order to adjust offsets of optical axes of plural multiplexed beams from the plural semiconductor lasers.

In the above configuration, because the first lens optical axis adjusting process is again performed and the offsets of the optical axes of the plural multiplexed beams may thereby be adjusted, the second lens portions 110, 120, and 130 do not have to be adjusted again. Accordingly, simpler and highly precise adjustment is possible.

[Additional Matters]

The present disclosure is not limited to the above-described embodiments. Various kinds of alternations are possible in the scope described in claims, and embodiments that are obtained by appropriately combining technical measures disclosed in the different embodiments are included in the technical scope of the present disclosure. In addition, new technical features may be formed by combining technical measures that are disclosed in the embodiments.

The present disclosure contains subject matter related to that disclosed in Japanese Priority Patent Application JP 2017-166142 filed in the Japan Patent Office on Aug. 30, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light source device comprising:
   a semiconductor laser;
   a first lens portion;
   a second lens portion; and
   a housing that retains the semiconductor laser, the first lens portion, and the second lens portion, wherein
   the housing has a first surface to which the first lens portion is fixed and a second surface to which the second lens portion is fixed,
   the first surface is vertical to a direction of an optical axis of the semiconductor laser and wider than a first fixing surface of the first lens portion that is fixed to the first surface, and
   the second surface is parallel to the direction of the optical axis and wider than a second fixing surface of the second lens portion that is fixed to the second surface.

2. The light source device according to claim 1, wherein
   the first lens portion is fixed to the first surface by an adhesive, and
   the second lens portion is fixed to the second surface by an adhesive.

3. The light source device according to claim 1, wherein the second surface is formed to be parallel with respect to the optical axis and to support the second lens portion.

4. The light source device according to claim 1, wherein
   the first lens portion has a first lens and a first lens retaining body that retains the first lens,
   the second lens portion has a second lens and a second lens retaining body that retains the second lens,
   a first end surface of the first lens retaining body on a light emission side is opposed to a second end surface of the second lens retaining body on a light incident side, and
   the light source device includes at least one of
   a structure in which an optical component which includes the first lens is arranged in a position withdrawn from the first end surface toward the light incident side, and
   a structure in which an optical component which includes the second lens is arranged in a position withdrawn from the second end surface toward the light emission side.

5. The light source device according to claim 1, wherein
   the housing has a first lens retaining recess that includes the first surface and retains the first lens portion, and
   the first lens retaining recess has an opposed surface that is opposed to a lower portion of the first lens portion.

6. The light source device according to claim 5, wherein the opposed surface is inclined with respect to a bottom portion of the housing.

7. The light source device according to claim 1, wherein a pair of the second surfaces are present on the housing, and the second lens portion is slidably supported by the pair of the second surfaces in the direction parallel to the direction of the optical axis.

8. The light source device according to claim 1, a plurality of the semiconductor lasers, a plurality of the first lens portions and a plurality of the second lens portions are present, each of the plurality of the semiconductor lasers having mutually different wavelength.

9. A manufacturing method of a light source device, the manufacturing method comprising:
   a first lens optical axis adjusting process of adjusting an optical axis of a first lens with respect to an optical axis of a semiconductor laser by sliding a first lens retaining body that retains the first lens on a first surface that is provided to a housing;
   a first lens fixing process of fixing the first lens retaining body to the first surface;
   a beam convergence-divergence adjusting process of adjusting a spot size of a beam that is emitted from a second lens by sliding a second lens retaining body that retains the second lens on a second surface that is provided to the housing; and
   a second lens fixing process of fixing the second lens retaining body to the second surface.

10. The manufacturing method of a light source device according to claim 9, the manufacturing method further comprising:
    sliding the first lens retaining body on the first surface that is vertical with respect to the optical axis in the first lens optical axis adjusting process; and
    sliding the second lens retaining body on the second surface that is parallel with respect to the optical axis in the beam convergence-divergence adjusting process.

11. The manufacturing method of a light source device according to claim 9, the manufacturing method further comprising:
    in the first lens optical axis adjusting process, sliding the first lens retaining body in a state where the housing is inclined with respect to a horizontal plane or in a state where the housing is arranged vertically with respect to the horizontal plane.

12. The manufacturing method of a light source device according to claim 9, wherein
    the light source device includes plural semiconductor lasers, and
    after the first lens optical axis adjusting process and the beam convergence-divergence adjusting process, the first lens optical axis adjusting process is again performed in order to adjust offsets of optical axes of plural multiplexed beams from the plural semiconductor lasers.

13. The manufacturing method of a light source device according to claim 9, wherein a pair of the second surfaces are present on the housing, and the second lens retaining body is sliidably retained on the pair of the second surfaces in the direction parallel to the direction of the optical axis so that the spot size of the beam is adjusted in the beam converge-divergence adjusting process.

\* \* \* \* \*